(12) United States Patent
Hellner et al.

(10) Patent No.: US 9,904,754 B2
(45) Date of Patent: *Feb. 27, 2018

(54) LAYOUT OF INTERCONNECT LINES IN INTEGRATED CIRCUITS

(71) Applicant: INTERNATIONAL BUSINESS MACHINES CORPORATION, Armonk, NY (US)

(72) Inventors: Gerhard Hellner, Schoenaich (DE); Iris M. Leefken, Dettenhausen (DE); Silke Penth, Holzgerlingen (DE); Tobias Werner, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/197,423

(22) Filed: Jun. 29, 2016

(65) Prior Publication Data

US 2017/0228487 A1 Aug. 10, 2017

Related U.S. Application Data

(63) Continuation of application No. 15/016,476, filed on Feb. 5, 2016.

(51) Int. Cl.
*G06F 17/50* (2006.01)

(52) U.S. Cl.
CPC ...... *G06F 17/5072* (2013.01); *G06F 17/5077* (2013.01)

(58) Field of Classification Search
USPC .......... 716/110, 111, 119, 122, 126
See application file for complete search history.

(56) References Cited

U.S. PATENT DOCUMENTS 5,247,455 A * 9/1993 Yoshikawa ......... G06F 17/5081
716/112
5,920,486 A 7/1999 Beahm et al.
(Continued)

FOREIGN PATENT DOCUMENTS

GB 2522102 A 7/2015

OTHER PUBLICATIONS

Vaidyanathan, Kaushik et al., "Sub-20 nm Design Technology Co-Optimization for Standard Cell Logic," ICCAD '14 Proceedings of the 2014 IEEE/ACM International Conference on Computer-Aided Design, Nov. 2014, pp. 124-131.
(Continued)

*Primary Examiner* — Brian Ngo
(74) *Attorney, Agent, or Firm* — Heslin Rothenberg Farley & Mesiti PC

(57) ABSTRACT

Generating layouts of nets connecting connection terminals of cells in an integrated circuit. Cell layouts of the cells with parameterized locations of the connection terminals, a connection specification of nets specifying electrical connections between the connection terminals, and design rules for the laying out of the nets, are received. A placed layout is generated with the cell layouts placed adjacent to each other in a row. The cell layouts are placed in the row enabling minimization of a selected function. According to the design rules, the nets are laid out as straight interconnects being parallel to a reference straight line using the parameterized locations of the connection terminals in the cell layouts. The laying out includes varying locations of the parameterized locations of the interconnection terminals.

12 Claims, 8 Drawing Sheets

(56) References Cited

U.S. PATENT DOCUMENTS

| | | |
|---|---|---|
| 7,266,796 B1 | 9/2007 | Chu et al. |
| 7,941,776 B2 | 5/2011 | Majumder et al. |
| 8,490,042 B2 | 7/2013 | Gao |
| 8,541,880 B2 | 9/2013 | Penzes |
| 8,612,914 B2 | 12/2013 | Sherlekar et al. |
| 2012/0119782 A1 | 5/2012 | Madurawe |
| 2014/0167818 A1 | 6/2014 | Eisenstadt |
| 2015/0100938 A1* | 4/2015 | Lu .................. G06F 17/5077 716/131 |
| 2015/0213177 A1* | 7/2015 | De Dood ........... G06F 17/5068 716/122 |
| 2016/0371418 A1 | 12/2016 | Beck et al. |

OTHER PUBLICATIONS

Hellner, Gerhard et al., "Layout of Interconnect Lines in Integrated Circuits," U.S. Appl. No. 15/016,476, filed Feb. 5, 2016, pp. 1-45.
List of IBM Patents or Patent Applications Treated as Related, Jul. 15, 2016, pp. 1-2.

\* cited by examiner

LAYOUT OF INTERCONNECT LINES IN INTEGRATED CIRCUITS

This application is a continuation of co-pending U.S. Ser. No. 15/016,476, entitled "LAYOUT OF INTERCONNECT LINES IN INTEGRATED CIRCUITS," filed Feb. 5, 2016, which is hereby incorporated herein by reference in its entirety.

BACKGROUND

Modern integrated circuits have billions of discrete elements (e.g. transistors). Terminals of the discrete elements are connected by multi-level wiring. The wiring is one of the critical elements of the integrated circuits determining an upper limit of clock frequencies of the integrated circuits. The wiring has to be designed in a way that it enables error free propagation of electrical signals synchronized with the clock frequency. This means that electrical signals have to be received at receiving terminals within a time window in a tact interval. The receipt of electrical signals has to be error free. As usual, it requires not only timely receiving of the electrical signals at the receiving terminals, but also satisfying a required slew rate of the electrical signals at the receiving terminals and/or minimization of cross talk between the wires (i.e., minimization of common run length).

Modern digital circuitry has tolerances for error free propagation of electrical signals in the picosecond range. The problem of finding an appropriate wiring topology is complicated by the need to design interconnect lines and the cells generating signals in the interconnect lines complying with the design rules. The last, but not least, problem is that for every next generation of integrated circuits (IC) on the technology development roadmap of semiconductors, the topological requirements for the layout of wiring get further restrained.

SUMMARY

Shortcomings of the prior art are overcome and additional advantages are provided through the provision of a computer-implemented method of generating layouts of nets connecting connection terminals of cells in an integrated circuit. The method includes receiving cell layouts of the cells with parameterized locations of the connection terminals, a connection specification of nets specifying electrical connections between the connection terminals, and design rules for laying out the nets; generating a placed layout with the cell layouts placed adjacent to each other in a row, wherein the cell layouts are placed in the row enabling minimization of a function of the following arguments: a sum of projections of distances between the connection terminals to be connected by nets on a reference straight line and a sum of lengths of overlapping fragments of the projections, wherein the function increases based on an increase in an argument; and laying out, according to the design rules, the nets as straight interconnects being parallel to the reference straight line using the parameterized locations of the connection terminals in the cell layouts, the laying out comprising varying locations of the parameterized locations of the connection terminals.

Computer program products and systems relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE DRAWINGS

In the following, embodiments of the invention are explained in greater detail, by way of example only, making reference to the drawings in which.

DETAILED DESCRIPTION

Various cells in ICs are connected by nets. The nets connect connection terminals of the cells. The nets are implemented as interconnects connecting connection terminals of the cells. The single net can be implemented as an interconnect in one or more interconnect metallization layers of ICs. As usual, one net connects one source cell (e.g., driver cells) to one or more sink cells (e.g., memory cells). In order to provide the required propagation of electrical signals in the nets, some nets have to be laid out as parallel straight interconnects in a metallization layer. Advantages of maximization of straight parallel interconnections in the metallization layer (e.g., M2 layer) can comprise at least one of the following: decrease in an overall number of metallization layers needed for implementation of interconnections in an IC, decrease in a number of vias in paths, decrease in electrical resistance of paths, and/or improved timing of propagation of the electrical signals in paths. The laying out of nets as straight interconnects in the metallization layer can further result in improvement of layouts of nets in one or more metallization layers below the metallization layer which paths have one or more of the aforementioned advantages.

At present, various methods are developed for minimization of jogs in the layouts of interconnects in metallization layers. However, the problem of generation of a completely jog-free layout cannot be based on an approach providing only minimization of jogs. Thus, there is a need for a fundamentally new method enabling the laying out of a jog-free metallization layer.

In general, generation of a layout is a multi-parameter optimization process. Straightforward simultaneous optimization of all variable parameters might result in an a large amount of combinations of which evaluation can require a supercomputer. The method for the laying out of a jog-free layout of a metallization layer addresses this issue, since it is based on a step-by-step generation of the layouts of nets in the metallization layer. In every step only one or more selected nets are laid out, wherein only a limited amount of variable parameters are used for the laying out of the one or more nets.

Figure 1C:
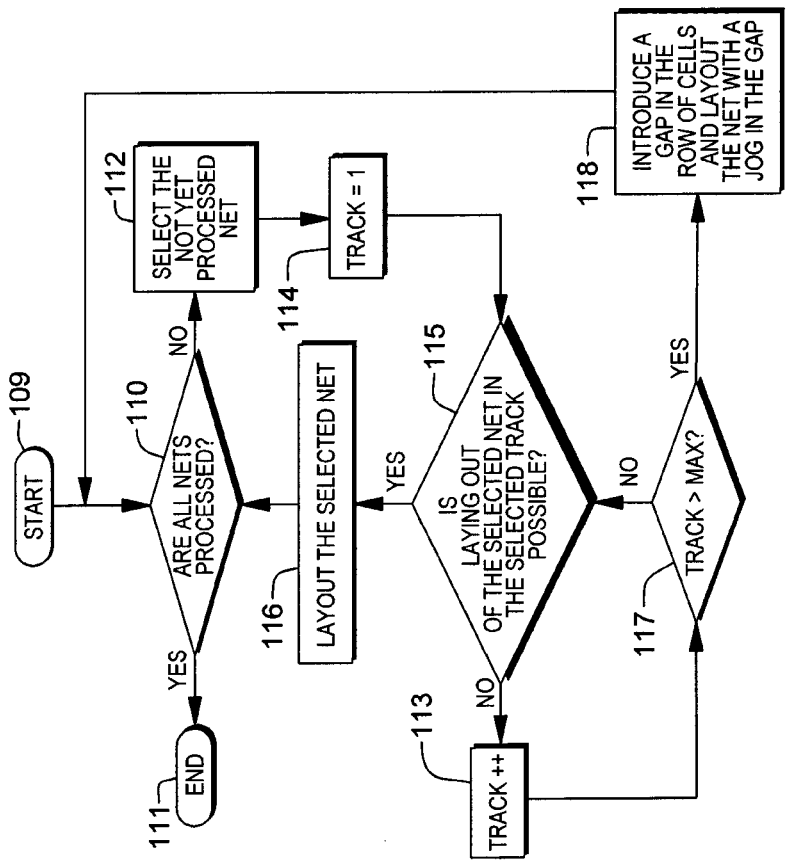
FIGS. 1a-1d depict one example of a flow diagram of a method for generating layouts of nets.
Figure 1A:
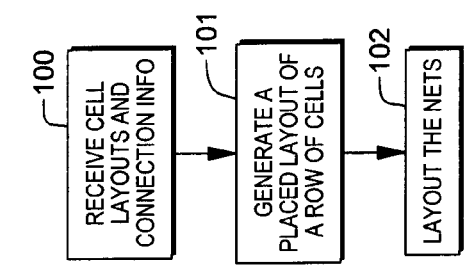

The method for generation of layouts of nets connecting connection terminals comprises major process blocks 100-102 depicted in FIG. 1a. In the process block 100, the following information is received: cell layouts of the cells with parameterized locations of the connection terminals, a connection specification of nets specifying electrical connections between the connection terminals, and design rules for the laying out of the nets.

In the process block 101, a placed layout with the cell layouts placed adjacent to each other in a row is generated. The cell layouts are placed in the row enabling minimization of a function of the following arguments: a sum of projections of distances between the connection terminals to be connected by nets on a reference straight line and a sum of lengths of overlapping fragments of the projections. The function increases in response to an increase in any of the arguments.

The function can be for instance a sum of a first sum multiplied by a first weight coefficient and a second sum multiplied by a second weight coefficient. The first sum is the sum of projections of distances between the connection terminals to be connected by nets on a reference straight line. The second sum is of lengths of overlapping fragments of the projections. The function increases in response to an increase in any of the arguments. As it will be clearly seen from a description further on, the first sum is a measure of overall length of interconnects in a metallization layer, and the second sum is a measure of common run length of the interconnects in a metallization layer. By selecting the appropriate first and second weight coefficients in the process of the generation of the layout, either minimization of the overall length of the interconnects or minimization of the common run length can be prioritized.

For instance, in order to set the minimization of the overall length of interconnects in a metallization layer, the first weight coefficient is to be (substantially) bigger than the second weight efficient.

The process block 101 can be performed by calculating values of the aforementioned function for all variants of placements of the cell layouts in rows and selecting the placed layout having the least value of the function in comparison with the other layouts.

In the process block 102, the nets are laid out according to the design rules as straight interconnects being parallel to the reference straight line using the parameterized locations of the connection terminals in the cell layouts. The laying out comprises varying locations of the parameterized locations of the interconnection terminals.

Placement of the locations can be parameterized in a direction being perpendicular to the reference straight line.

Splitting of the processes of placing the cells in a row and subsequently generating layouts of the nets can be advantageous because the process of laying out is split into stages, wherein in each stage only a limited amount of the variable parameters is varied. As a result thereof, a number of variants evaluated in each of the stages is substantially less than an overall number of all possible variants of layouts.

In another embodiment, the generating includes mirroring of one or more cell layouts.

This measure can be effective for the generation of a placed layout characterized by further minimization of the aforementioned function.

In another embodiment, geometrical centers of geometrical footprints of the cell layouts are placed on a line parallel to the reference straight line.

In another embodiment, the order of the laying out of the nets is determined by ranking of each one of the nets according to a ranking function.

Introduction of the ranking function can be advantageous for the effective generation of the layouts of the nets. The nets having the longest layouts in the plane of the metallization layer (e.g., extension or spread) and/or connecting of the biggest amounts of the connection terminals (e.g., the biggest number of sink connections) of the cells can be layout at first (i.e., have the highest ranking), since their layouts are the most complex. As it will be clear from the following examples, the most complex layouts have fewer options for laying out, since they are long and connect a large number of the connection terminals.

In another embodiment, positioning of the parameterized locations of the connection terminal being parameterized may be in a direction perpendicular to the reference straight line.

Orientation of the parameterized placement of the connection terminals being perpendicular to the reference straight line can be advantageous because it does not influence the value of the aforementioned function to be minimized.

In another embodiment, the ranking function of the net is a measure of a projection of the distance between the two outermost connection terminals of the net on the reference line.

Such a selection of the ranking function can be advantageous because the longest nets (i.e., the most complex) are laid out first.

In another embodiment, wherein in case the net can be laid out in more than one way as a single straight interconnect being parallel to the reference straight line by using the different parameterized locations, the laying out of the not yet laid out net is performed using a constraint criterion reducing a solution parameter space of layouts of the not yet laid out net to a single layout.

This embodiment can address an issue when a net can be laid out in more than one way. Using the preprogrammed constraint criterion can enable automation of the laying out process.

In another embodiment, according to the constraint criterion, the single layout of the net has the smallest distance between the straight interconnect of the layout of the net and the reference straight line in the solution parameter space.

This embodiment can be advantageous because it specifies preferential filling of the metallization layer with interconnects (i.e., layouts of nets).

In another embodiment, the method further comprises: laying out, in a metallization layer of the IC, the nets except at least one net having the connection terminals of the cells having their layouts placed in the row next to each other and laying out the at least one net in another metallization layer of the IC being below the metallization layer of the IC.

This embodiment can be advantageous because it enables the generating of layouts of nets in at least two metallization layers. It might be possible to layout a net connecting only two neighboring connection terminals in a metallization layer being below the metallization layer wherein the majority of nets are laid out.

In another embodiment, the laying out, according to the design rules, of the nets comprises the following in case the net cannot be laid out as a single straight interconnect being parallel to the reference straight line by using the different parameterized locations of the connection terminals: introducing a gap between the cell layouts in the row, the gap being placed between the connection terminals to be connected by the net; extending the layouts of the already laid out nets over the gap; laying out of a first straight interconnect fragment of a layout of the net in the metallization layer, the first straight interconnect fragment connecting a first set of connection terminals, the first set of connection terminals comprising a first connection terminal placed in the gap and all connection terminals to be connected by the net, which are placed in a portion of the row placed on one side from the gap; laying out a second straight interconnect fragment of the layout of the net in the metallization layer, the second straight interconnect fragment connecting a second set of connection terminals, the second set of the connection terminals comprising a second connection terminal placed in the gap and all connection terminals to be connected by the net, which are placed in a portion of the row placed on another side from the gap; and laying out a third fragment of the layout of the net in another metallization layer of the IC, the third fragment connecting the first and the second connection terminals and being placed in the gap, the other metallization layer being placed below the metallization layer.

This embodiment can be advantageous because by introducing the gap between the neighboring cells, a net which cannot be laid out as a straight interconnect, is laid out as two straight interconnects in the metallization layer connected by an auxiliary interconnect in a metallization layer below the metallization layer.

In another embodiment, in case when the connection terminals to be connected by the net are placed in the layouts of more than two cells, the gap introduced between the cell layouts in the row is placed next to the layout of a source cell being one of the cells which layouts comprise the connection terminals to be connected by the net.

This embodiment can be advantageous because it specifies the criteria for a selection of the placement of the gap when more than one placement is possible. Programming of these criteria can enable automated implementation of the method.

In another embodiment, in case when the connection terminals to be connected by the net are placed in the layouts of more than two cells, the gap is introduced between the cell layouts in the row in a way enabling minimization of a number of the layouts of the already laid out nets extended in the extending of the layouts of the already laid out nets over the gap.

This embodiment can be advantageous because it specifies the criteria for a selection of the placement of the gap when more than one placement is possible. Programming of these criteria can enable automated implementation of the method. This criterion enables minimization of a number of the nets which layouts are extended as a result of the introduction of the gap.

Figure 1B:
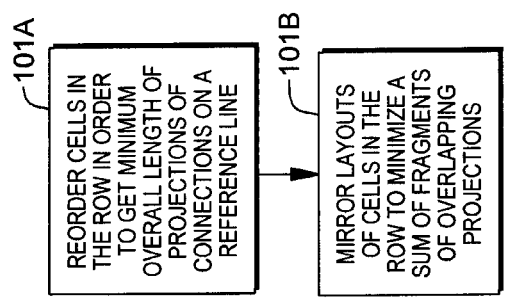

Process blocks 101A and 101B depicted in FIG. 1b illustrate an example implementation of the process block 101 in greater detail. In the process block 101A, the placements of cells in rows are evaluated in order to select the placement having the least length of projections of connections of the connection terminals on the reference line.

Figure 2A:
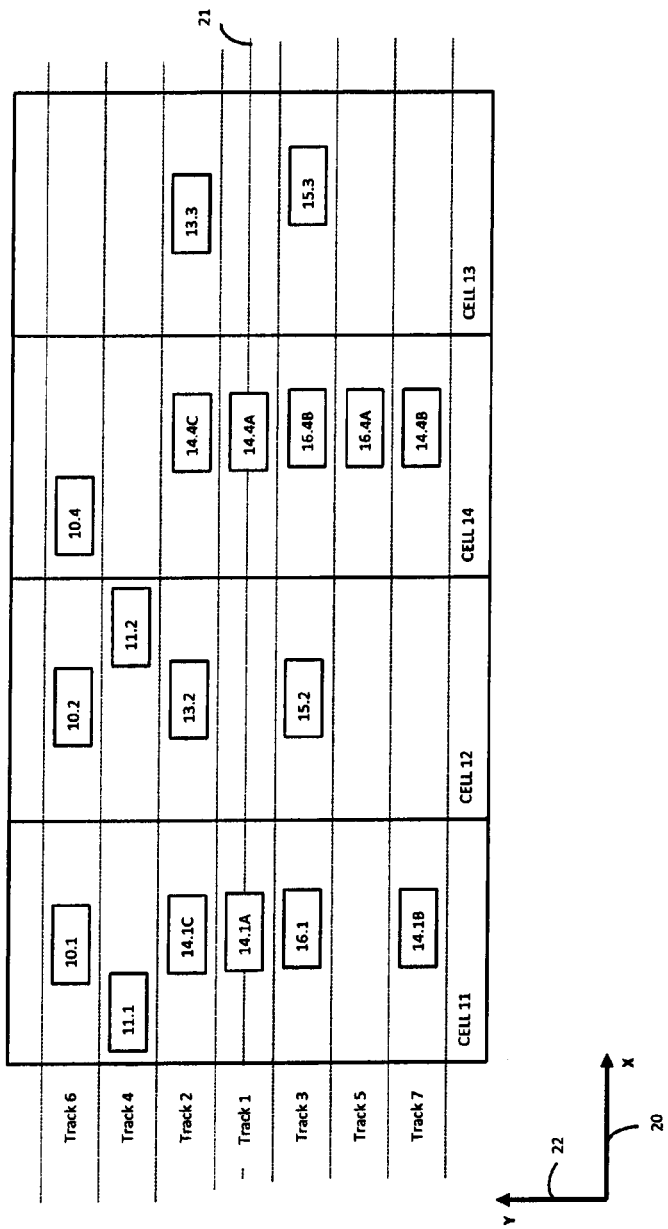
FIGS. 2a-2e depict example layouts for an IC generated in a process of execution of a method for generating layouts of nets.
Figure 2B:
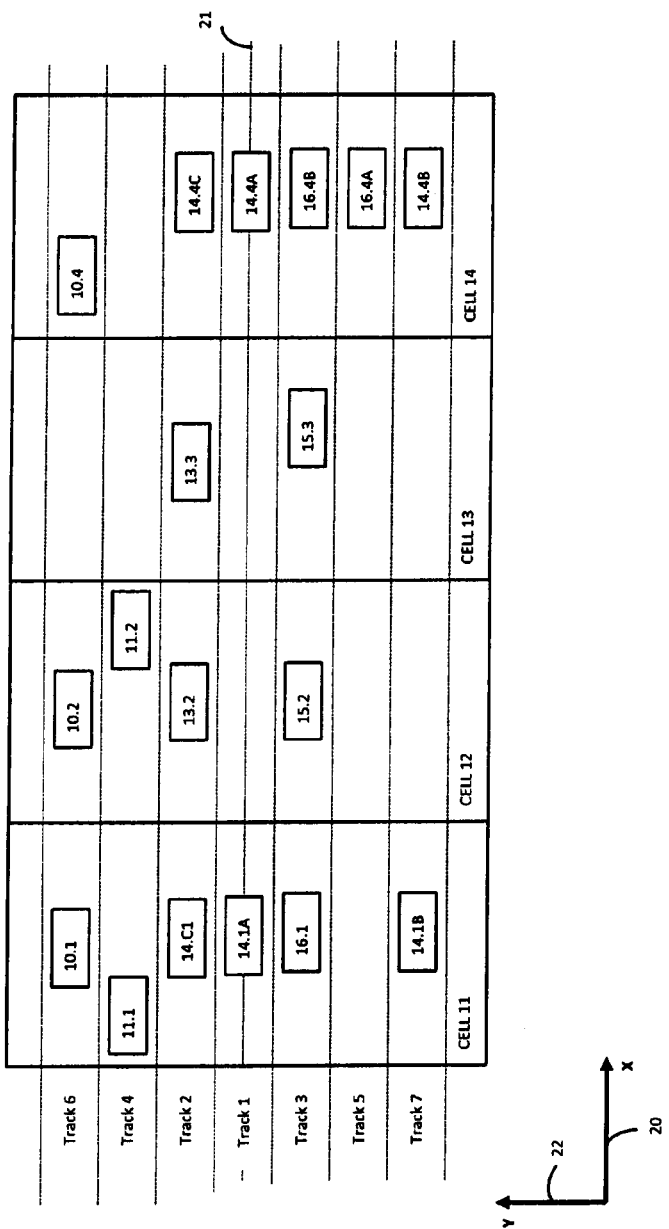

Two examples of placements of the cells in the rows are depicted in FIGS. 2a and 2b. The row of cells depicted In FIG. 2a has four cells 11-14 aligned along x-axis 20. The cells are placed in the following sequence: 11, 12, 14, 13. The reference straight line 21 is parallel to x-axis 20 and to top (bottom) edges of geometrical footprints of the cells.

According to the connection specification received in process block 100, the connection terminals 10.1 of cell 11, 10.2 of cell 12, and 10.4 of cell 14 are connected by net 10. The connection terminals 11.1 of cell 11 and 11.2 of cell 12 are connected by net 11. The connection terminals 13.2 of cell 12 and 13.3 of cell 13 are connected by net 13. The connection terminal 14.1 of cell 11 and connection terminal 14.4 of cell 14 are connected by net 14. The placements of the connection terminals 14.1 and 14. 4 are parameterized along y-axis 22 being perpendicular to the x axis 20. Parameterized placement of the connection terminal 14.1 is depicted in FIGS. 2a-2e as multiple connection terminals 14.1A, 14.1B, and 14.1C. Parameterized placement of connection terminal 14.4 is depicted in FIGS. 2a-2e as multiple connection terminals 14.4A, 14.4B, and 14.4C. The laid out net 14 is to connect one of connection terminals 14.1A, 14.1B, or 14.1C to one of connection terminals 14.4A, 14.4B, or 14.4C. The connection terminals 15.2 of cell 12 and 15.3 of cell 13 are connected by net 15. The connection terminals 16.1 of cell 11 and 16.4 of cell 14 are connected by net 16. The placements of the connection terminal 16.4 are parameterized along y-axis 22. Parameterized placement of connection terminal 14.1 (14.4) is depicted in FIGS. 2a-2e as two connection terminals 14.1A (14.4A) and 14.1B (14.4B).

For the layout in FIG. 2a, the projections on x axis 20 of distances between connection terminals 10.1 and 10.4, 11.1 and 11.2, 13.3 and 13.2, 14.1A and 14.4A, 15.2 and 15.3, and 16.1 and 16.4A are calculated in process block 101A. The same procedure is performed for the layout in FIG. 2b. The layout in FIG. 2a differs from the layout in FIG. 2b by swapped placement of the cells CELL 13 and CELL 14. Since the drawings in FIGS. 2a-2e are not to scale and merely for illustrative purposes, it is assumed that the sum of distance projections of the cell row depicted in FIG. 2a is less than the sum of distance projections of the cell row depicted in FIG. 2b. Thus, according to the process block, the placed layout depicted in FIG. 2b is selected for further processing in the process block 101A.

Figure 2C:
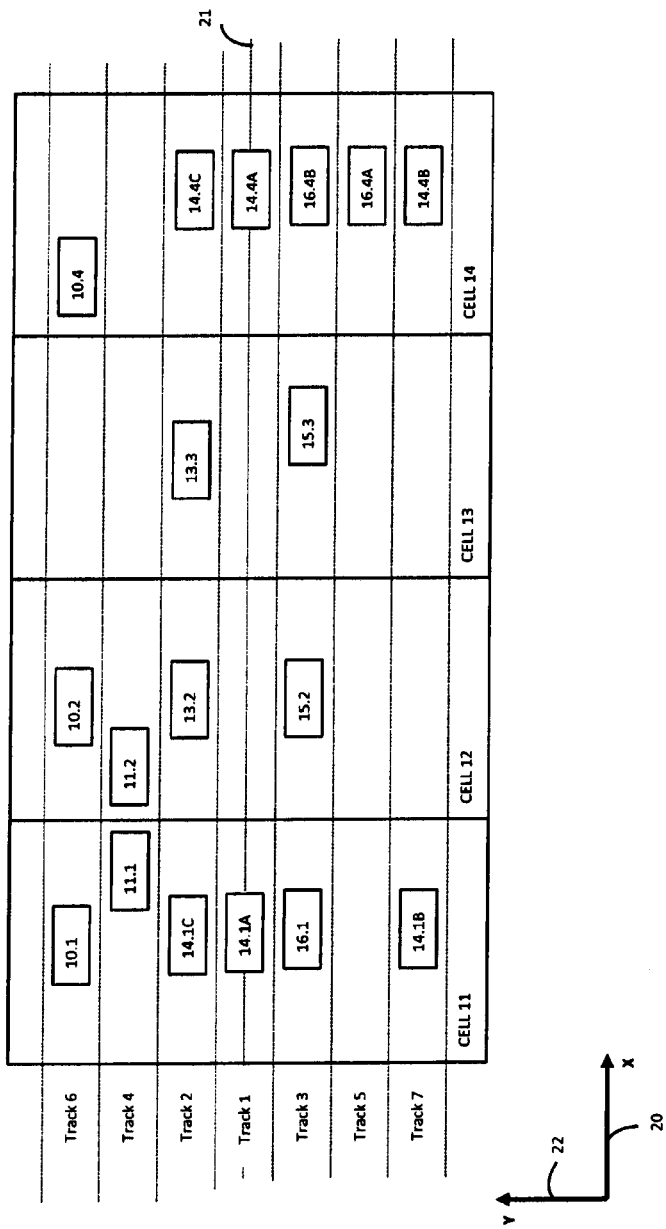

In process block 101B, one or more layouts of cells in the row are mirrored to minimize a sum of fragments of overlapping projections on the straight reference line (e.g., line 21) of the distances between the connection terminals. Execution of process block 101B is illustrated in FIG. 2c, wherein the placed layout depicted in FIG. 2b is used as input for the process block 101B. The layouts of cells 11 and 12 are mirrored in FIG. 2c in comparison with their layouts in FIG. 2b. As a result thereof, overlap of projections on the straight reference line 21, a distance between connection terminals 11.1 and 11.2 and other distances between connection terminals (e.g. 10.1-10.4) is reduced.

In process block 102, the nets are laid out one by one, wherein the sequence of the laying out (i.e., generation of a layout of a wiring connecting connection terminals to be connected according to a specification of the net) is determined by a rank of the net according to a ranking function. The ranking function can be a measure of a distance between two outermost connection terminals in the placed layout. For instance, net 10 connects 3 connection terminals 10.1, 10.2, and 10.4 in the placed layout in FIG. 2b. The ranking of net 10 in this case is a measure of a distance between terminals 10.1 and 10.4.

Figure 2D:
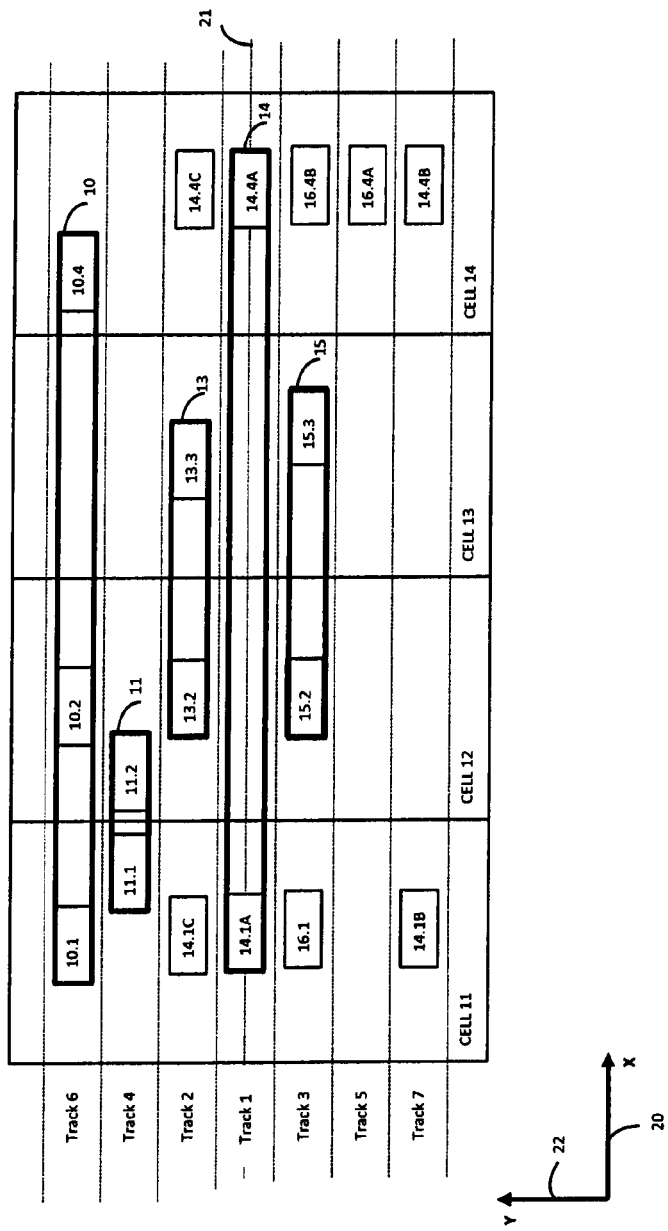

Before assigning ranking values to the nets, the placed layout can be evaluated for a presence of pairs of the neighboring connection terminals of different cells to be connected by a layout of the net (e.g., connection terminals 11.1 and 11.2 to be connected by layout of net 11 as depicted in FIGS. 2c and 2d). When the net connects only a pair of such neighboring connection terminals it can be laid out in a metallization layer (e.g., Metal 1) being below another metallization layer in which the ranked nets are to be laid out (e.g., Metal 2). The laying out of the net in the metallization layer being below the other metallization layer can be done when the layout of the nets in this metallization layer does not contradict design rules and do not overlap layouts of internal interconnects of the cells in this metallization layer. Alternatively, the ranking values can be assigned to all nets and they can be selected for laying out as a matter of general routine for the laying out of each net.

Figure 2E:
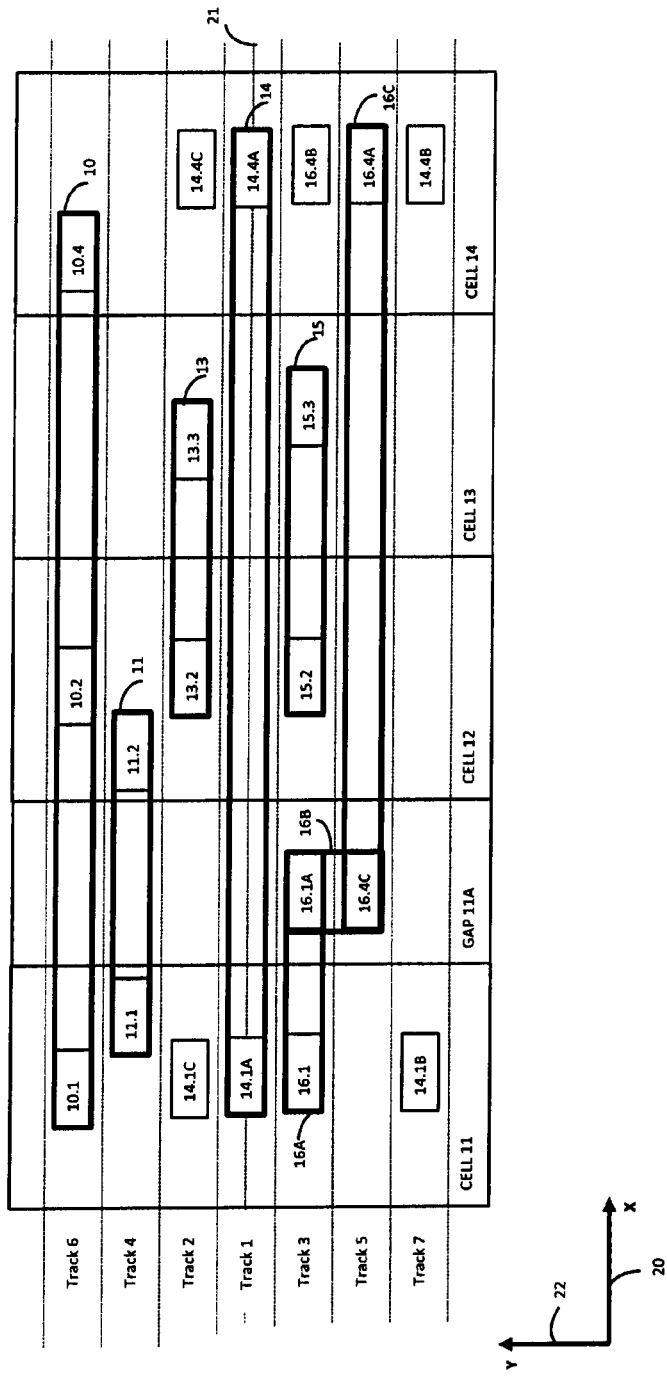

In case the distances between the respective pairs of the outermost connection terminals of the nets are equal, the ranking of these nets can be selected at random or any additional criterion can be used for determining the difference between the rankings of these nets. For instance, the net which connection terminals are placed closer to the reference straight line 21 has higher (lower) ranking than the other net. When the aforementioned definition of ranking is applied to the example placed layout depicted in FIG. 2c, the nets are to be laid out in the following order: 14, 16, 10, 15, 13, 11. According to this ranking, net 14 is to be laid out first and net 11 is to be laid out last. However, merely for illustrative purposes, the sequence of laying out the nets in the example placed layout depicted in FIGS. 2c-2e is changed. The nets are to be laid out according to the following sequence: 14, 10, 15, 13, 11, 16.

The ranking function is not limited to the aforementioned example. An additional or alternative characteristic value of the net, which can be used for definition of the ranking function, can be a number of connection terminals connected by the net. In general, the ranking function can be a sum of the characteristic values each multiplied by its respective weight coefficient. Some of the weight coefficients can be even equal to zero in order to "switch off" influence of the particular net characteristic value. Yet another option is assigning ranking values to the nets at random.

FIG. 1c depicts a detailed example implementation of process block 102. In process block 109, the wiring of nets is started. Decision process block 110 is executed after the process block 109. It loops sequential processing of nets until all nets are processed. When all nets are processed, it causes execution of process block 111, wherein the processing of nets is ended; otherwise, it causes execution of process block 112, wherein the next net is selected for processing according to its ranking or at random.

Process block 114 is executed after process block 112. In this process block, a first preferential area (a first track area) for placement of the layout of the net is selected. Since the net can have parameterized placement of connection terminals, it may be laid out in several different ways as a straight interconnect in a single metallization layer. When more than one layout is possible, i.e. at least two layouts do not contradict design rules and do not overlap already laid out nets, one layout is to be selected according to additional selection criterion in order to enable automation of the laying out process. The additional selection criterion can be a distance between the layout of the net (i.e., straight interconnect) and a straight reference line being parallel to the x-axis 20 (e.g., line 21 on which geometrical centers of geometrical footprints of cells are located). The position of the straight reference line determines in this case preferential placement of the net layouts. In the aforementioned example, layouts are placed as close as possible to geometrical centers of the geometrical footprints of the cells. The reference straight line can be placed in many other different ways. For instance, it can be placed below the row of the placed layouts of the cells. In this case, the layouts of the nets being closer to the border of the row of the placed layouts adjacent to the straight reference line will be selected.

Different laying out options can be readily understood on a basis of laying out net 14, which can be laid out in three different ways by generating a layout connecting one of the following pairs of terminals 14.1A-14.4A, 14.1B-14.4B, or 14.1C-14.4C (FIG. 2c). Since the reference straight line 21 goes through the geometrical centers of the geometrical footprints of the cell layouts, the layout connecting the terminals 14.1A and 14.A is generated (FIG. 2d). The laying out of net 14 in a way that it connects connection terminals 14.1C and 14.4C is disadvantageous because it makes impossible to layout net 13 connecting connection terminals 13.2 and 13.3.

The aforementioned issue of selecting a layout of a net out of several optional layouts can be implemented by selecting several track areas on 1-7 on an overall geometrical footprint of the placed layout of the cell layouts (FIGS. 2a-2e). The track areas are parallel to the straight reference line 21. Each track area has its ranking. The ranking of the track areas depicted in FIGS. 2a-2e is the same as their numbering. The algorithm depicted in FIG. 1c investigates an opportunity to layout the selected net in the track area having the highest ranking (Track 1 in FIGS. 2a-2e). If this appears to be impossible (e.g., not all connection terminals to be connected by the net are placed within the first track area and/or laying out of the net results in a layout which overlaps previously generated layouts of other nets) a possibility to layout the net in another track area having the next ranking is investigated and so on until a track area in which the laying out is possible is identified. If the latter is not the case, process block 118 is executed. In this process block, a gap is introduced in the row of the placed cell layouts between the layouts of cells to be connected by the net. In process block 118, various options for laying out the net as two straight interconnects in the metallization layer are investigated, wherein the straight interconnects are connected by another interconnect placed in the gap and in a metallization layer below the metallization layer in which the two straight interconnects are laid out. The same algorithm for placing these two straight interconnects in the same track areas according to their rankings can be used as for placing layouts which can be laid out as single straight interconnects.

Turning back to the flow diagram depicted in FIG. 2c, the track having the highest ranking is selected in process block 114 executed after process block 112. The selection of the track area having the highest ranking can be performed by assigning unity to the track counter. In decision process block 115, a possibility for laying out the net in the selected track area is investigated. The net can be laid out in the selected track area if all terminals to be connected by the net are placed in the selected track area and the layout of the net does not intersect previously laid out nets. If the layout is possible, then decision process block 115 causes execution of process block 116 in which the net previously selected in process block 112 is laid out. The described above decision process block 110 is executed after process block 116. If laying out the net in the selected track area is not possible, then decision process block 115 causes execution of process block 113 wherein a track counter is increased by unity. This means that the track area having the nets following number or ranking is selected unless the maximum number of the track areas is exceeded. If the latter is not the case, decision process block 117 causes execution of decision process block 115; otherwise, it causes execution of process block 118, which will be described further on.

Execution of a flow chart depicted in FIG. 1c for all nets, except net 16 being the last in the ranking, determining the sequence of the laying out results in the laying out of nets 14, 10, 15, 13, 11 as depicted in FIG. 2d. Net 14 is laid out first because it has the highest ranking. It is laid out in the first track area (Track 1). A sequence of process blocks 110, 112, 114, 115, and 116 is executed for laying out net 14. Net 10 is laid out after net 14 because it has the second ranking. A sequence of process blocks 110, 112, 114, 115, 113, 117, 115, 113, 117, 115, 113, 117, 115, 113, 117, 115, 113, 117, 115, 116 is executed for the laying out of net 10. Net 15 is laid out after net 10 because it has the third ranking. A sequence of process blocks 110, 112, 114, 115, 113, 117, 115, 113, 117, 115, 116 is executed for the laying out of net 15. Net 13 is laid out after net 15 because it has the fourth ranking. A sequence of process blocks 110, 112, 114, 115, 113, 117, 115, 116 is executed for the laying out of net 13. Net 11 is laid out after net 13 because it has the fifth ranking. A sequence of process blocks 110, 112, 114, 115, 113, 117, 115, 113, 117, 115, 113, 117, 115, 116 is executed for the laying out of net 11.

Net 16 being the last in the ranking is not laid out as a single straight interconnect. Although connection terminals 16.1 and 16.4B of net 16 are placed within the track area 3 (FIG. 2d), the laying out of a single straight interconnect connecting these connection terminals is not done because the layout of net 16 will overlap the layout of net 15, which is already generated. A sequence of process blocks 110, 112, 114, 115, 113, 117, 115, 113, 117, 115, 113, 117, 115, 113, 117, 115, 113, 117, 115, 113, 117, 118 is executed for the laying out of net 16.

Figure 1D:
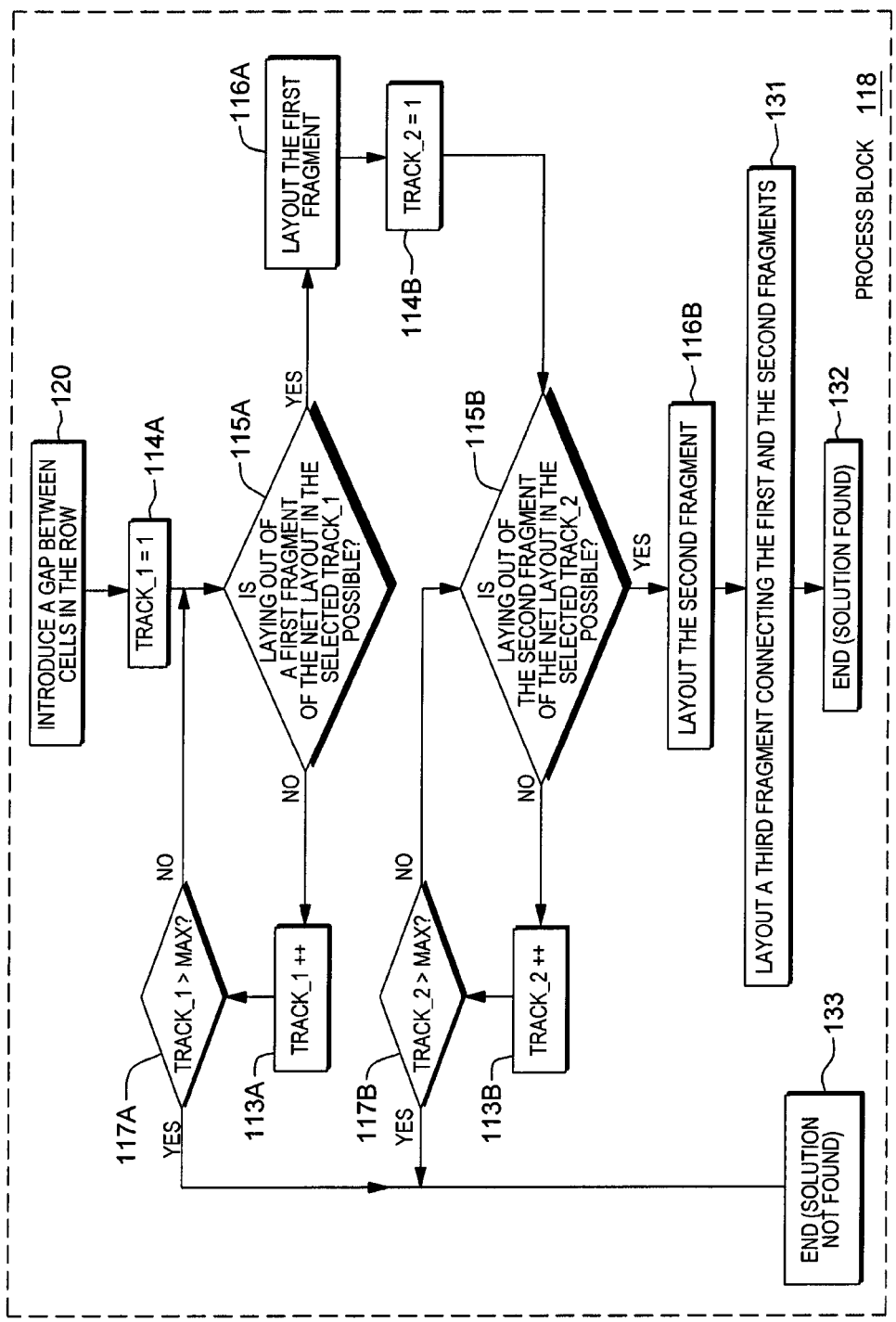

FIG. 1d illustrates a flow diagram of process blocks representing an example implementation of process block 118. First, in a process block 120, a gap is introduced between placed cell layouts of the cells to be connected by the net, which layout is to be generated in process block 118. If there are more than two cells, which connection terminals are ought to be connected by the layout of the net, various placements of the net is possible. Turning back to an example layout depicted in FIG. 2e, it is easy to see that a gap needed for the laying out of net 16 can be introduced between the following pairs of cells 11 and 12, cells 12 and 13, and cells 13 and 14. The placement of the gap can be selected at random or obey rules. One of the rules can be placing the gap in a way that a minimum amount of already laid out nets are to be extended over the gap. As it can be clearly seen from FIG. 2e, when the gap is placed between cells 11 and 12, 3 nets 10, 11, 14 are to be extended over the gap. In contrast, when the gap is placed between cells 12 and 13, 4 nets 10, 13, 14, 15 are to be extended over the gap.

Another rule for placing the gap can be placing the gap neighboring a layout of a cell being a source cell to be connected by a layout of the net to one or more layouts of cells being sink cells. Assuming that cell 11 is a source cell and cell 14 is a sink cell, then according to this rule, the gap 11A has to neighbor upon cell 11 as depicted in FIG. 2e.

A first set of process blocks 114A, 115A, 116A, 117A, and 113A and a second set of process blocks 114B, 115B, 116B, 117B, and 113B are executed in the same way as a set of the corresponding process blocks 114, 115, 116, 117, 113. However, in contrast to the process blocks depicted in FIG. 1c, the process blocks of the first and second set are configured to generate only a first and second fragment of the layout of the net correspondingly (corresponding process blocks 116A and 116B). Execution of the second set of process blocks for laying out the second fragment is started only when the laying out of the first fragment of the lay out of the net is successfully accomplished in the first set of the process blocks (decision process block 115A is to cause execution of process block 116A); otherwise, decision process block 117A causes termination of the laying out of the net (process block 133). The laying out of the net is terminated, as well if the laying out of the second fragment is not possible (decision process block 117B causes execution of process block 133). When the laying out of the first (second) fragment is possible, it is laid out as a single straight interconnect in a metallization layer, wherein the first (second) fragment connects all connection terminals to be connected by the net, which are placed on one (another) side from the gap in the row of placed cell layouts, to an (another) auxiliary connection terminal placed in the gap.

Examples of the first 16A and the second 16C fragments are depicted in FIG. 2e. The first fragment of the layout of net 16 connects connection terminal 16.1 to auxiliary connection terminal 16.1A in gap 11A. The second fragment of the layout of net 16 connects connection terminal 16.4A to auxiliary connection terminal 16.4C in gap 11A.

If in the second set of process steps the laying out of the second fragment is successfully accomplished (i.e., process block 116B is executed), process block 131 is executed after process block 116B. In process block 131, a layout of a third fragment of the net is laid out in the gap. The third fragment connects the first fragment to the second fragment, i.e. connects the auxiliary terminals in the gap. The third fragment is laid out in a metallization layer being below the metallization layer in which the first and the second fragments are laying out. Example of the third fragment 16B is depicted in FIG. 2e. It connects auxiliary terminal 16.1A to auxiliary terminal 16.4C.

Process block 132 is executed after process block 131. In process block 132, an information indicating a successful layout of the net is sent and process blocks which execution follows the execution of process block 118 in the flow chart depicted in FIG. 1c is performed. If there is a need to repeat execution of process block 118 in a course of execution of the flow chart depicted in FIG. 1c, then the process block is not executed because the gap is already generated in a course of previous execution of process block 118.

If process block 133 is executed and there is at least another option for placing a gap neighboring upon another pair of placed cell layouts in the row, then the flow chart of process blocks depicted in FIG. 1d is repeated. In this case, the previously generated gap is removed and another gap placed in a different location is generated in process block 120. In the case when one or more nets are already laid out, the nets have their respective third fragments laid out in the previously generated gap, then layouts of these nets are deleted as well and the flow chart of process blocks depicted in FIG. 1d is repeated for these nets using the newly generated gap.

The laying out of net 16 depicted in FIG. 2e is performed by executing the following process blocks of the flow chart depicted in FIG. 1d: 120, 114A, 115A, 113A, 117A, 115A, 113A, 117A, 115A, 116A, 114B, 115B, 113B, 117B, 115B, 113B, 117B, 115B, 113B, 117B, 115B, 113B, 117B, 115B, 116B, 131, 132.

Figure 3:
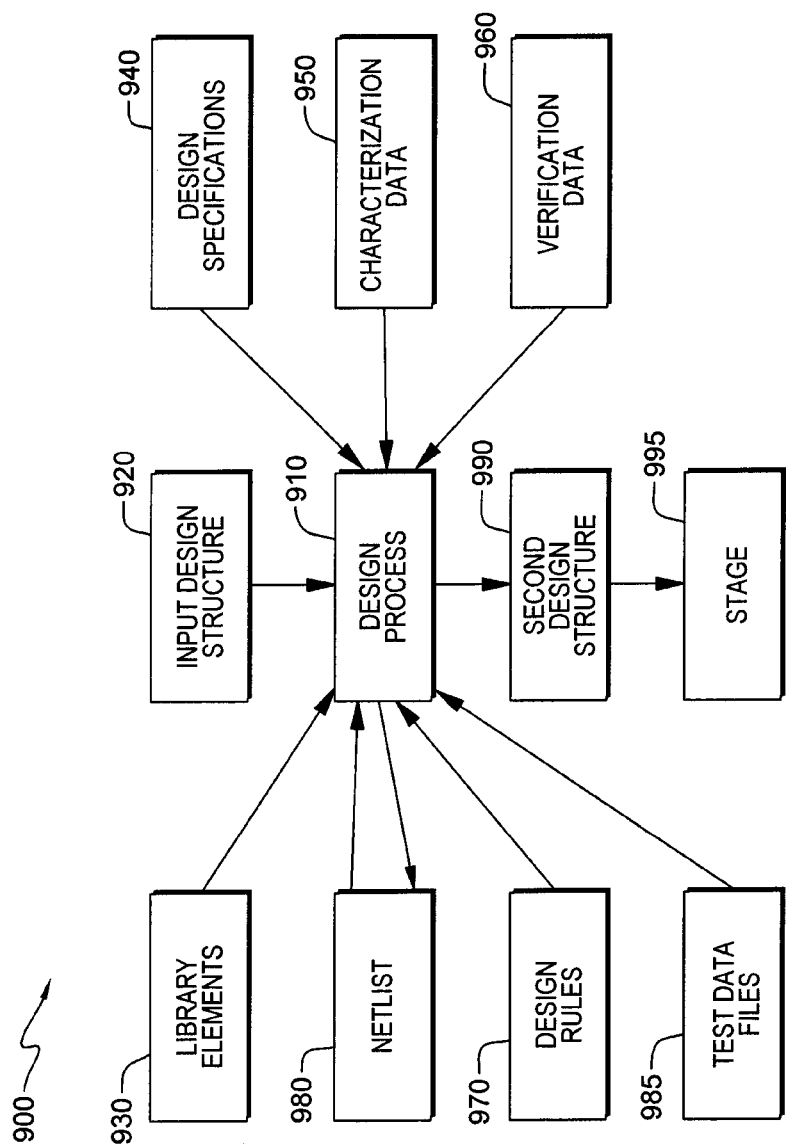
FIG. 3 depicts one example of a flow diagram of a design process used in semiconductor design, manufacture, and/or test.

FIG. 3 is a flow diagram of a design process used in semiconductor design, manufacture, and/or test. The process for generating of layouts of the nets connecting the connection terminals in placed cell layouts, which flow diagram is depicted in FIGS. 1a-1d, can be a part of the design process depicted on FIG. 3. FIG. 3 shows a block diagram of an example design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2a-2e. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 920 that is, e.g., processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system, such as shown in FIGS. 2a-2e. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages, such as Verilog and VHDL, and/or higher level design languages such as C or C++.

Design process 910 employs and incorporates, for instance, hardware and/or software modules for synthesizing, translating, or otherwise processing a design/simulation functional equivalent of the components, circuits, devices, or logic structure shown in FIGS. 2a-2e to generate a netlist 980 which may contain design structures, such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium, such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20 nm, 32 nm, 45 nm, 90 nm, etc.). The data structure types may further include design specifications 940, characterization data 950, verification data 960, design rules 970, and test data files 985, which may include input test patterns, output test results, and other testing information. Design process 910 may further include, for example, standard mechanical design processes, such as stress analysis, thermal analysis, mechanical event simulation, process simulation for operations, such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes, such as timing analysis, verification, design rule checking, place and route operations, etc.

Design process 910 employs and incorporates logic and physical design tools such, as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g., information stored in a IGES (Initial Graphics Exchange Specification), DXF (Drawing Interchange Format), Parasolid XT, JT, DRG, or any other suitable format for storing or rendering such mechanical design structures). Similar to design structure 920, design structure 990 comprises, e.g., one or more files, data structures, or other computer-encoded data or instructions that reside on transmission or data storage media and that when processed by an ECAD system generate a logically or otherwise functionally equivalent form of one or more of the embodiments of the invention shown in FIGS. 1a-1d and 2a-2e. In one embodiment, design structure 990 may comprise a compiled, executable HDL simulation model that functionally simulates the devices shown in FIGS. 2a-2e.

Design structure 990 may also employ a data format used for the exchange of layout data of integrated circuits and/or symbolic data format (e.g., information stored in a GDSII (GDS2) (GDS-Graphic Database system), GL1, OASIS, map files, or any other suitable format for storing such design data structures). Design structure 990 may comprise information, such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1a-1d. Design structure 990 may then proceed to a stage 995 where, for example, design structure 990: proceeds to tape-out, is released to manufacturing, is released to a mask house, is sent to another design house, is sent back to the customer, etc.

As described herein, a jog free layout of a metallization layer in an integrated circuit is, as understood here, a layout of a metallization layer having any of its interconnects parallel to any other of its interconnects. In other words, the layout does not comprise any interconnects (and their fragments) oriented in any other than a specified direction being parallel to a wafer surface.

An aspect of the present invention provides for a computer-implemented method for generating layouts of nets connecting connection terminals of cells in an IC, a computer system comprising a computer processor and a memory storing processor executable code which execution causes the computer system to perform the computer-implemented method, and a computer readable medium having stored thereon computer executable code for execution by a computer processor controlling a computer system comprising a memory, wherein execution of the instructions of the executable code causes the computer processor to execute the computer-implemented method.

One embodiment provides for a computer-implemented method for generating layouts of nets connecting connection terminals of cells in an IC. The method comprises the following: receiving cell layouts of the cells with parameterized locations of the connection terminals, a connection specification of nets specifying electrical connections between the connection terminals, and design rules for laying out the nets; generating a placed layout with the cell layouts placed adjacent to each other in a row, wherein the cell layouts are placed in the row enabling minimization of a function of the following arguments: a sum of projections of distances between the connection terminals to be connected by nets on a reference straight line and a sum of lengths of overlapping fragments of the projections, wherein the function increases in response to an increase in any of the arguments; and laying out, according to the design rules, the nets as straight interconnects being parallel to the reference straight line using the parameterized locations of the connection terminals in the cell layouts, the laying out comprising varying locations of the parameterized locations of the interconnection terminals.

Another embodiment provides for a computer system comprising a computer processor and a memory storing a processor executable code. The execution of the processor executable code by the processor causes the computer system to perform the aforementioned computer-implemented method for the generating of layouts of the nets connecting connection terminals of cells in the IC.

Another embodiment provides for a computer readable medium having stored thereon computer executable code for execution by a computer processor controlling a computer system comprising a memory. The execution of the instructions of the executable code causes the computer processor to execute the aforementioned computer-implemented method for generating layouts of the nets connecting connection terminals of cells in the IC.

The method as described above is used, for instance, in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of aspects of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of aspects of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method of generating layouts of nets connecting connection terminals of cells in an integrated circuit (IC), the computer-implemented method comprising:
    receiving cell layouts of the cells with parameterized locations of the connection terminals, a connection specification of nets specifying electrical connections between the connection terminals, and design rules for laying out the nets;
    generating a placed layout with the cell layouts placed adjacent to each other in a row, wherein the cell layouts are placed in the row enabling minimization of a function of the following arguments: a sum of projections of distances between the connection terminals to be connected by nets on a reference straight line and a sum of lengths of overlapping fragments of the projections, wherein the function increases based on an increase in an argument;
    laying out, according to the design rules, the nets as straight interconnects being parallel to the reference straight line using the parameterized locations of the connection terminals in the cell layouts, the laying out comprising varying locations of the parameterized locations of the connection terminals; and
    fabricating, utilizing the nets, an integrated circuit.

2. The computer-implemented method of claim 1, wherein the generating comprises mirroring one or more of the cell layouts.

3. The computer-implemented method of claim 1, further comprising placing geometrical centers of geometrical footprints of the cell layouts on a line parallel to the reference straight line.

4. The computer-implemented method of claim 1, wherein an order of laying out the nets is determined by ranking each one of the nets according to a ranking function.

5. The computer-implemented method of claim 4, wherein the ranking function of a net is a measure of a projection of a distance between two outermost connection terminals of the net on the reference straight line.

6. The computer-implemented method of claim 1, further comprising positioning the parameterized locations of a connection terminal being parameterized in a direction perpendicular to the reference straight line.

7. The computer-implemented method of claim 1, wherein based on a net being able to be laid out in more than one way as a single straight interconnect being parallel to the reference straight line by using different parameterized locations, the laying out of a not yet laid out net is performed using a constraint criterion reducing a solution parameter space of layouts of said not yet laid out net to a single layout.

8. The computer-implemented method of claim 7, wherein according to the constraint criterion the single layout has a smallest distance between the straight interconnect of the layout of said not yet laid out net and the reference straight line in the solution parameter space.

9. The computer-implemented method of claim 1, wherein the laying out comprises:
   laying out, in a metallization layer of the IC, the nets, except at least one net, having the connection terminals of the cells having their layouts placed in the row next to each other; and
   laying out the at least one net in another metallization layer of the IC, the other metallization layer being below the metallization layer of the IC.

10. The computer-implemented method of claim 1, wherein the laying out, according to the design rules of the nets comprises the following, based on a net not being able to be laid out as a single straight interconnect being parallel to the reference straight line by using different parameterized locations of the connection terminals:
   introducing a gap between the cell layouts in the row, the gap being placed between the connection terminals to be connected by said net;
   extending layouts of the already laid out nets over the gap;
   laying out a first straight interconnect fragment of a layout of said net in a metallization layer, the first straight interconnect fragment connecting a first set of connection terminals, the first set of connection terminals comprising a first connection terminal placed in the gap and connection terminals to be connected by said net, which are placed in a portion of the row placed on one side from the gap;
   laying out a second straight interconnect fragment of the layout of said net in the metallization layer, the second straight interconnect fragment connecting a second set of connection terminals, the second set of the connection terminals comprising a second connection terminal placed in the gap and connection terminals to be connected by said net, which are placed in a portion of the row placed on another side from the gap; and
   laying out a third fragment of the layout of the net in another metallization layer, the third fragment connecting the first connection terminals and the second connection terminals and being placed in the gap, the other metallization layer being placed below the metallization layer.

11. The computer-implemented method of claim 10, wherein based on the connection terminals to be connected by said net being placed in the layouts of more than two cells, the gap introduced between the cell layouts in the row is placed next to the layout of a source cell, the source cell being one of the cells which layouts comprise the connection terminals to be connected by said net.

12. The computer-implemented method of claim 10, wherein based on the connection terminals to be connected by said net being placed in the layouts of more than two cells, the gap is introduced between the cell layouts in the row in a way enabling minimization of a number of the layouts of the already laid out nets extended in the extending of the layouts of the already laid out nets over the gap.

* * * * *